(12) United States Patent
Furuhata

(10) Patent No.: US 6,355,526 B1
(45) Date of Patent: *Mar. 12, 2002

(54) NON-VOLATILE SEMICONDUCTOR MEMORY DEVICE AND METHOD OF MANUFACTURING THE SAME

(75) Inventor: Tomoyuki Furuhata, Sakata (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/272,243

(22) Filed: Mar. 19, 1999

(30) Foreign Application Priority Data

Mar. 20, 1998 (JP) .......................... 10-092490

(51) Int. Cl.[7] .......................................... H01L 21/8247
(52) U.S. Cl. ...................................................... 438/258
(58) Field of Search ................................. 438/257–267

(56) References Cited

U.S. PATENT DOCUMENTS

| 4,775,642 A | * | 10/1988 | Chang et al. | |
| 4,808,261 A | * | 2/1989 | Ghidini et al. | |
| 4,997,777 A | * | 3/1991 | Boivin | |
| 5,658,813 A | * | 8/1997 | Enomoto | 438/258 |
| 5,789,294 A | * | 8/1998 | Choi | 438/258 |
| 5,846,861 A | * | 12/1998 | Saitoh | 438/258 |
| 5,976,934 A | * | 11/1999 | Hayakawa | 438/258 |
| 6,083,791 A | * | 7/2000 | Bergemont | 438/258 |

FOREIGN PATENT DOCUMENTS

JP  A-6-275847  9/1994

* cited by examiner

Primary Examiner—Richard Booth
(74) Attorney, Agent, or Firm—Oliff & Berridge, PLC

(57) ABSTRACT

A non-volatile semiconductor memory device and a method of manufacturing that device. A silicon oxide layer is formed on a polysilicon layer. A control gate and a gate electrode are simultaneously formed by selectively etching the polysilicon layer by using the silicon oxide layer as a mask. A floating gate is then formed by selectively etching the polysilicon layer by using the silicon oxide layer on the control gate as a mask.

8 Claims, 13 Drawing Sheets

NON-VOLATILE SEMICONDUCTOR MEMORY DEVICE AND METHOD OF MANUFACTURING THE SAME

BACKGROUND OF THE INVENTION

1. Field of the Invention

The present invention relates to a non-volatile semiconductor memory device for storing information by accumulation of an electric charge and a method of manufacturing thereof. More specifically, the present invention relates to a non-volatile semiconductor memory device in which a memory element is selectively activated by a field effect transistor and a method of manufacturing thereof.

2. Description of the Prior Art

As a non-volatile semiconductor memory device having memory elements provided with floating gates and control gates, a flash memory can be mentioned as an example. A variety of designs are available for flash memories, one of which is a device in which a memory element is selectively activated by a field effect transistor. A flash memory with such a configuration has been disclosed, for example, in Japanese Patent Application Laid-Open No. 6-275847. In the following. a method of manufacturing the flash memory disclosed in the Japanese Patent Application Laid-Open No.6-275847 is described with reference to FIGS. 23 to 31.

As shown in FIG. 23, on a principal surface of a semiconductor substrate 200, a silicon oxide layer 202 an a tunnel oxide layer is grown, and then a polysilicon layer 204 as a floating gate is formed. Part of the polysilicon layer 204 that is positioned over an access transistor formation region 232 is selectively etched an shown in FIG. 24, and remaining part of the polysilicon layer 204 positioned over a memory element formation region 234 is left. This remaining part of the polysilicon layer 204 is hereinafter referred to as a polysilicon layer 204a. As shown in FIG. 25, an ONO-layer 206 is formed on the polysilicon layer 204a, and a silicon oxide layer 208 as a gate oxide layer is formed over the access transistor formation region 232. Subsequently, a polysilicon layer 210 is formed on the ONO-layer 206 and the silicon oxide layer 208.

As shown in FIG. 26, a resist 212 is prepared on the polysilicon layer 210 which is then selectively etched by using the resist 212 as a mask, thereby forming a gate electrode 214 over the access transistor formation region 232 while leaving part of the polysilicon layer 210 that is positioned over the memory element formation region 234. The remaining part of the polysilicon layer 210 over the memory element formation region 234 is hereinafter referred to as a polysilicon layer 210a. This etching exposes the silicon oxide layer 208 on a principal surface 236 of the semiconductor substrate 200, in the area between the gate electrode 214 and a floating gate to be formed in a later step. Next, as shown in FIG. 27, the resist 212 is removed and a resist 216 in prepared over the memory element formation region 234 and the access transistor formation region 232. The resist 216 is patterned so that it provides a mask for forming a control gate.

Note that the resist 216 is patterned so that it covers the gate electrode 214, while at the same time its edge 216a does not overlap the polysilicon layers 204a and 210a. The gate electrode 214 has to be covered by resist 216 because the gate electrode 214 is formed of a material identical to that of the control gate and the floating gate, i.e. polysilicon, and therefore has to be protected from being etched away during the etching step to form the control gate and the floating gate. The patterning is provided in such a way that the edge 216a does not overlap the polysilicon layers 204a and 210a because when the polysilicon layers 204a and 210a are etched later to form the control gate and the floating gate, unnecessary polysilicon layers 204a and 210a are left on the principal surface of the semiconductor substrate 200 if the edge 216a overlaps the polysilicon layers 204a and 210a. Consequently, the resist 216 is patterned while being the silicon oxide layer 208 exposed on a principal surface 236 of the semiconductor substrate 200, in the area between the gate electrode 214 and a floating gate to be formed in a later step.

The polysilicon layer 210a is selectively etched by using the resist 216 as a mask to form a control gate 219. The ONO-layer 206 is then selectively etched by using the resist 216 as a mask, as shown in FIG. 29. This etching removes the exposed portion of the silicon oxide layer 208 and exposes the principal surface 236 in the area between the gate electrode 214 and a floating gate to be formed in a later step.

As shown in FIG. 29, the polysilicon layer 204a is selectively etched by using the resist 216 as a mask, thereby forming a floating gate 220. Since the principal surface 236 is exposed, the principal surface 236 is also etched to unavoidably form a groove section 222 on the principal surface 236. Subsequently, an ion implantation is provided on the principal surface of the semiconductor substrate 200 by using the resist 216 as a mask, thereby forming a source/drain 224 in the memory element formation region 234 as well an an impurity region 226 electrically connected to the source/drain 224, in the groove section 222.

A silicon oxide layer 228 is grown on the principal surface of the semiconductor substrate 200 as shown in FIG. 30, followed by the formation of a contact hole 238 on the silicon oxide layer 228 so that the source/drain 224 is exposed. As shown in FIG. 31, an aluminum wiring 230 is then provided on the silicon oxide layer 228. The aluminum wiring 230 is also formed on the contact hole 238 and is electrically connected to the source/drain 224. A memory element 242 is provided with the control gate 218, the floating gate 220, and the source/drain 224, whereas an access transistor 244 is provided with the gate electrode 214 and the source/drain 240.

As described above, the control gate 218 and the gate electrode 214 have conventionally been prepared in separate steps. Consequently, there is a need to allow for a margin for aligning a mask for forming the control gate 218 and a mask for forming the gate electrode 214, which has caused an obstacle for reducing the space between the control gate 218 and the gate electrode 214.

SUMMARY OF THE INVENTION

The present invention has been made to eliminate the above-described problems with the prior art. Accordingly, an object of the present invention in to provide a non-volatile semiconductor memory device which can reduce the space between a control gate and a gate electrode and a method of manufacturing thereof.

According to one aspect of the present invention, there is provided a method of manufacturing a non-volatile semiconductor memory device that comprises:

a semiconductor substrate having a principal surface including a first region and a second region;

at least one memory element including a floating gate formed on the first region and a control gate formed on the floating gate; and at least one access gate transistor for selectively activating the memory element, comprising a gate electrode formed on the second region.

This method comprises the steps of;

forming a tunnel insulation layer on the first region;

forming on the tunnel insulation layer a first conductive layer that functions as the floating gate;

forming a dielectric layer on the first conductive layer;

forming a gate insulation layer on the second region;

forming a second conductive layer on the dielectric layer and gate insulation layer;

forming on the second conductive layer a masking layer that has a different etching rate from the first conductive layer and functions as a mask when the first conductive layer is selectively etched;

selectively etching the masking layer and second conductive layer to simultaneously form the control gate and gate electrode, while leaving the masking layer on the control gate;

forming a first resist to cover the gate electrode; and selectively etching the first conductive layer by using the masking layer on the control gate as well as the first resist as masks to form the floating gate.

In the method of manufacturing a non-volatile semiconductor memory device according to the present invention, since the control gate and the gate electrode are simultaneously formed, there is no need to allow for the margin for aligning the masks for forming the control gate and the gate electrode. Consequently, the present invention makes it possible to reduce the space between the control gate and the gate electrode. The control gate and the gate electrode can be simultaneously formed because the present invention allows the formation of the floating gate by using the masking layer formed on the control gate as a mask. Therefore, in the step of forming the first resist to cover the gate electrode, there is no need to form the first resist on the second conductive layer on the first region. In the prior art method, by contrast, the control gate and the floating gate have been formed by selectively etching the second and the first conductive layers by using the first resist as a mask.

The serial steps from forming the masking layer up to simultaneously forming the control gate and gate electrode may comprise the steps of: forming a second resist on the masking layer; and selectively etching the masking layer and the second conductive layer by using the second resist as a mask to form the control gate and gate electrode simultaneously.

The serial steps from forming the masking layer up to simultaneously forming the control gate and gate electrode may comprise the steps of; forming a third resist on the masking layer; selectively etching the masking layer by using the third resist as a mask; and selectively etching the second conductive layer by using the masking layer as a mask to form the control gate and gate electrode simultaneously.

The masking layer may comprise an insulation layer. The masking layer also may comprise a silicon oxide layer. The masking layer may have a thickness from 200 to 300 nm.

The non-volatile semiconductor memory device may be provided with a plurality of the memory elements and a plurality of the access gate transistors, each of the access gate transistors selectively activating only one of the memory elements.

According to another aspect of the present invention, there is provided a non-volatile semiconductor memory device for storing information through the accumulation of an electric charge, comprising:

a semiconductor substrate having a principal surface comprising a first region and a second region;

at least one memory element comprising a floating gate formed in the first region and a control gate formed on the floating gate;

at least one access gate transistor comprising a gate electrode formed on the second region for selectively activating the memory element;

a first layer that is located on the control gate and has the same width as the control gate and a different etching rate from the floating gate; and a second layer that is located on the gate electrode and has the same width as the gate electrode and the same composition as the first layer.

The first layer may be smaller than the second layer in thickness.

The memory element may comprise a first source/drain formed in the first region, and a second source/drain that is formed in the first region apart from the first source/drain, the floating gate and control gate being located between the first source/drain and second source/drain; the access gate transistor may comprise a third source/drain which is formed in the second region and a fourth source/drain that is formed in the second region apart from the third source/drain, the gate electrode being located between the third source/drain and fourth source/drain; a groove section may be unavoidably formed on the principal surface in the area between the floating gate and gate electrode; and an impurity region for electrically connecting the second source/drain to the third source/drain may be formed in the semiconductor substrate to cover the groove section.

The impurity concentration of the impurity region may be higher than the impurity concentration of each of the first source/drain and fourth source/drain.

Each of the first and second layers may comprise an insulation layer.

Each of the first and second layers may comprise a silicon oxide layer.

The first layer may be 80 to 200 nm in thickness, and the second layer may be 200 to 300 mm in thickness.

The non-volatile semiconductor memory device may be provided with a plurality of the memory elements and a plurality of the access transistors, each of the access gate transistors selectively activating only one of the memory elements.

Note that when the word "on" is used to explain the positional relationship between two layers of the device in the present application, there may exist other layers between those two layers.

DESCRIPTION OF PREFERRED EMBODIMENTS

Each of the embodiment examples described below is an application of the present invention to a non-volatile semiconductor memory device provided with a plurality of memory elements and a plurality of access transistors for selectively activating the memory elements, in such a manner that each access transistor selectively activates only one memory element. However, the present invention is not limited to those described below but can be equally well applied to non-volatile semiconductor memory devices wherein memory elements are selectively activated by access transistors of types such as NOR, NAND, or DINOR, for example.

Figure 3:
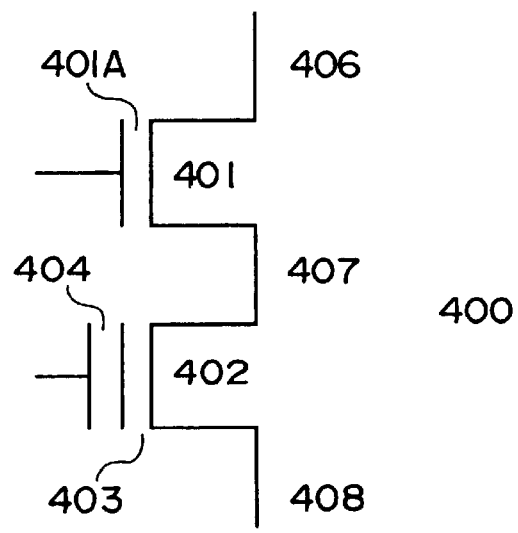
FIG. 3 is a schematic diagram of a memory cell of the flash memory manufactured by the first embodiment of the method of manufacturing a non-volatile semiconductor memory device of the present invention.
Figure 4:
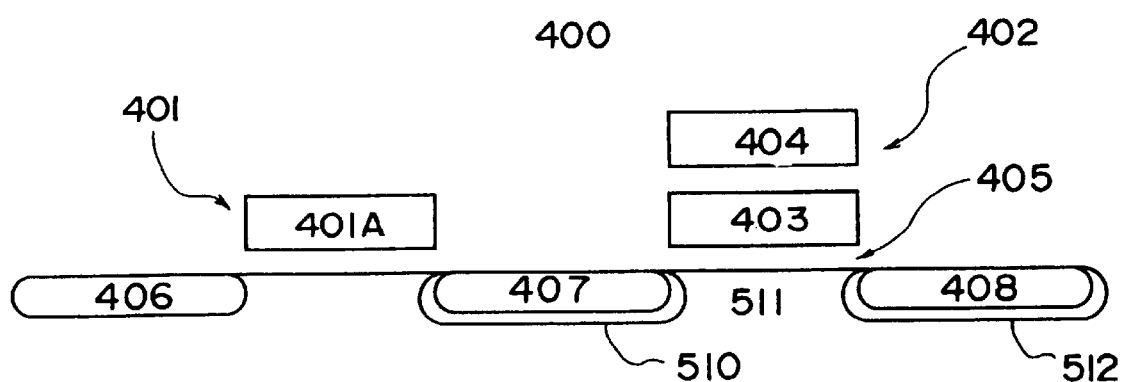
FIG. 4 is a schematic cross-sectional view of a memory cell of the flash memory manufactured by the first embodiment of the method of manufacturing a non-volatile semiconductor memory device of the present invention.
Figure 5:
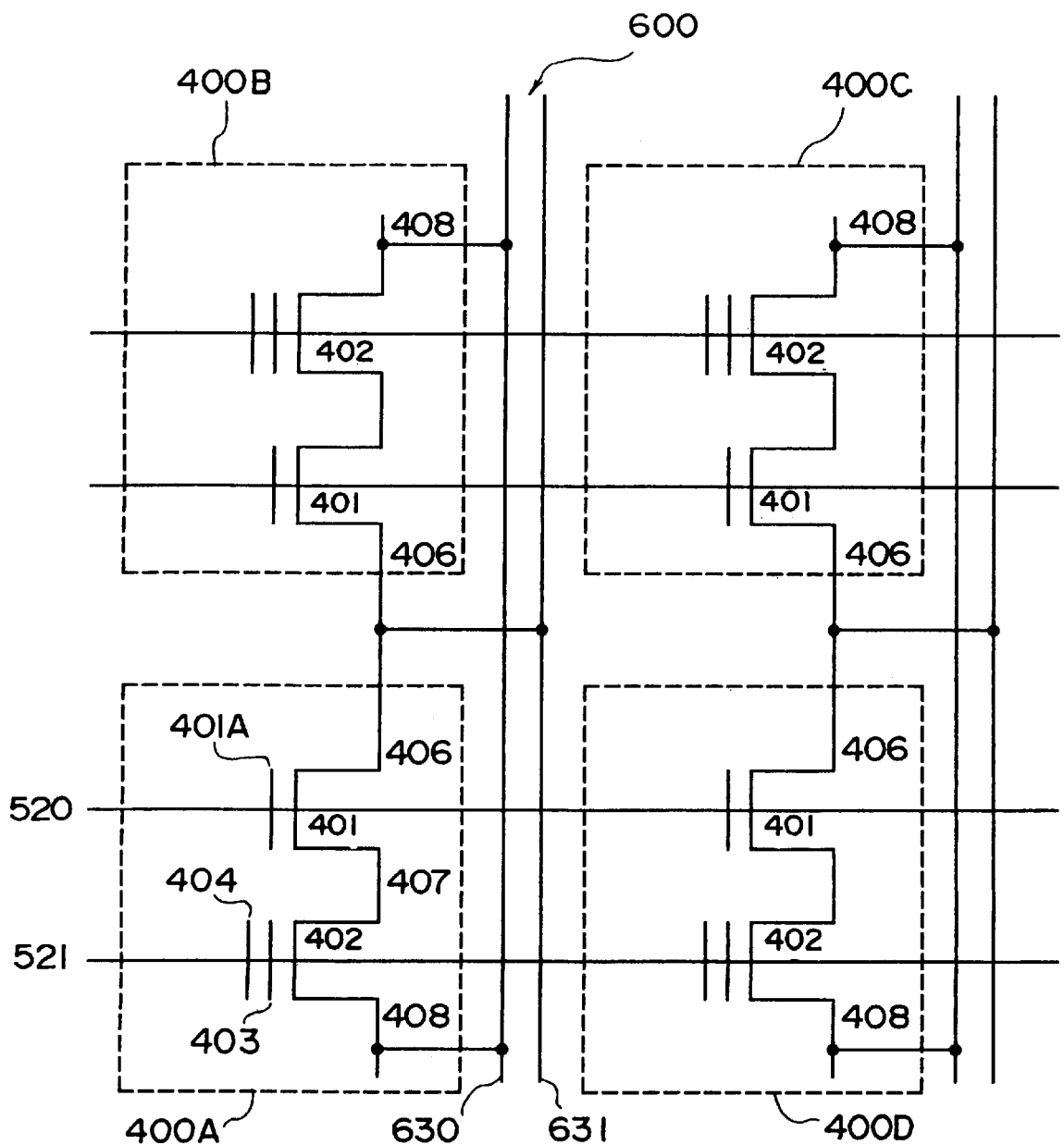
FIG. 5 is a schematic diagram of a memory cell array of the flash memories manufactured by the first embodiment of the method of manufacturing a non-volatile semiconductor memory device of the present invention.

Referring to FIGS. 3, 4, and 5, descriptions are first given on a non-volatile semiconductor memory device provided with a plurality of memory elements and a plurality of access transistors for selectively activating the memory elements, in such a manner that each access transistor selectively activates only one memory element. FIG. 3 in a schematic view of a memory cell 400 of a flash memory of the above type. The memory cell 400 has an access transistor 401 and a memory transistor 402 which is a memory element. The access transistor 401 has a gate 401A and the memory transistor 402 has a floating gate 403 and a control gate 404.

The access transistor 401 is an N-channel MOSFET with a threshold voltage of approximately 0.7 V.

Programming of the memory cell 400 by channel hot electron is achieved by simultaneously applying a high positive programming voltage $V_{pp}$. For example, 5 to 12 V may be applied to the gate 401A of the access transistor 401, and 12 V to the control gate 404 of the memory transistor 402, while holding a source 408 of the memory transistor 402 at a ground potential $V_{gp}$, and applying a positive programming pulse to a drain 406 of the access transistor 401. A programming pulse of about 5 V can be applied for 100 microseconds, for example. Referring to FIG. 4, a drain 407 of the memory transistor 402 (which is also the source of the access transistor 401) has a high-concentration doping region 510 to the substrate. This ion implantation to the drain enhances the electric field in a channel region 511 close to the drain 407, thereby accelerating the electrons and generating a distribution of high energy electrons which are energetic enough to overcome the potential energy barrier and to transfer through a thin tunnel layer and into the floating gate 403 (e.g. for hot electron injection). This ion implantation highly doping the drain 407 can multiply the speed of programming. Note that the access transistor 401 uses a smaller fraction of the applied drain pulse voltage, since the width of the access transistor 401 is typically within the range of 1.0 to 5.0 $\mu$m, compared with the 0.25 to 1.5 $\mu$m of the memory transistor 402.

Erasure of the memory cell 400 is achieved by applying 5 V to the source 408 of the memory translator 402 while holding the control gate 404 at −7 V. A high electric field is generated in a tunnel oxide layer 405 (shown in FIG. 4), thereby allowing the electrons collected in the floating gate 403 to overcome the potential energy barrier and tunnel (by Fowler-Nordheim tunneling, for example) through the tunnel oxide layer 405 to the source 408 of the memory transistor 402. During the erasure, A voltage of 5 to 12 V is applied to the gate 401A and the drain 406 in left floating.

The source 408 of the memory transistor 402 is also formed by high-concentration doping 512 of the substrate. This high-concentration doping increases the dielectric breakdown of the junction, thereby significantly accelerating the transfer of electrons from the floating gate during the erasure. In this manner, the memory transistor 402 erases during the erasure operation to the point at which its threshold voltage is negative. Thus the memory transistor 402 cannot be turned off by the control gate 404. However, the access transistor 401 prevents this over erasure from affecting cell performance. More specifically, the access transistor 401 is not controlled by the state of the floating gate, so the threshold voltage of the access transistor 401 remains at approximately 0.7 V.

Various operating conditions can be set, other than these described above for programming and erasure operations. The conditions described below can also be set, for example, when programming and erasure are both provided by Fowler-Nordheim tunneling. Programming conditions can be: −8 V at the control gate, the source in floating, 8 V at the drain, and 8 V at the gate of the access transistor. Erasure conditions can be: 8 V at the control gate, −8 V at the source, the drain in floating, and 8 V at the gate of the access transistor.

A schematic view of a memory array 600 which comprises memory cells 400A to 400D is shown in FIG. 5. Each of these memory cells is identical to the memory cell 400. The drains 406 of the access transistors 401 of the cells 400A and 400B are coupled to a metal drain bit line 631, and the sources 409 of the memory transistors 402 of these cells 400A and GOB are coupled to a metal source bit line 630. The gates 401A of the access transistors 401 of the memory cells 400A and 400D are coupled to a word line 520, and the control gates 404 of the memory cells 400A and 400D are coupled to a control line 521.

Referring to FIG. 5, the reading of the memory cell 400A, for example, is accomplished by applying a standard voltage $V_{cc}$, (usually 5 V) to the gate 401A via the word line 520 as well as to the control gate 404 via the control line 521, while simultaneously sensing the read current flowing through the memory cell 400A by a conventional sense amplifier (not shown in the figure) that is connected to the drain bit line 631. If the memory cell 400A has been erased (i.e., if there is a zero charge or net positive charge on the floating gate 403), both the access transistor 401 and the memory transistor 402 are turned on, allowing a current to flow through the memory cell 400A which can be sensed by the sense amplifier. If the memory cell 400A is programmed (i.e., if there a net negative charge on the floating gate 403), the threshold voltage of the memory transistor 402 rises above the supply voltage $V_{cc}$, preventing current from flowing through the memory cell 400A.

In this configuration, the sense amplifier which receives the voltage from the drain bit line generates a feedback voltage to the source bit line 630, which increases the voltage on the source bit line 630 during a read operation. This slows down the voltage drop on the drain bit line 631. Thus, the present invention significantly reduces the time required for the bit lines to recover their original state so that they can perform sensing during the next logic state cycle, in comparison with conventional memory cell arrays.

The main limitation to scaling of the memory transistor 402 is the punch-through requirement. Capacitive coupling between the drain 407 and the floating gate 403 typically causes the memory transistor 402 to be turned on by the coupling to the drain 407. This capacitive coupling limits the scalability of the channel length of the channel region 511 (see FIG. 4) and thus limits the improvement in programming speed that is necessary for the 5-volt programming capability. More specifically, capacitive coupling from the drain 407 to the floating gate 403 degrades the punch-through margin of the memory transistor 402, and limits the capability of the memory transistor 402 to handle the drain voltage. The capacitive coupling effect does not scale with the gate line width of the memory transistor 402 because of the strong affect of fringing capacitance, which is the capacitance other than parallel-plate capacitance. Therefore, the effect of this drain coupling becomes more dominant for smaller geometries and poses a serious limitation to the scaling of conventional EEPROM and flash memories that do not have access gates. Note that the programming speed increases exponentially with the reciprocal of the effective channel length.

The memory cell of the present invention solves this scaling problem by the inclusion of the access transistor 401 within the memory cell 400. Since this memory cell eliminates punch-through of the memory transistor 402 in programming mode, the channel length of the channel region 511 can be scaled. This scalability means that the channel length can be reduced, which significantly increases the programming speed of the memory cell in comparison with the prior art. Moreover, the doping to the drain 407 enables the memory cell 400 to achieve a full 5-volt programming capability.

First Embodiment

Figure 1:
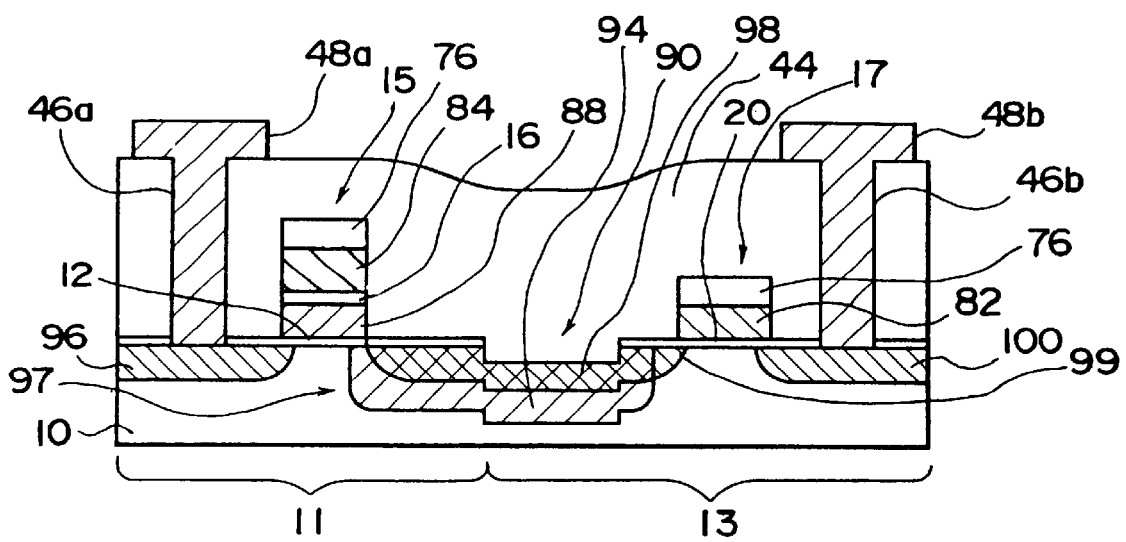
FIG. 1 is a cross-sectional view of a non-volatile semiconductor memory device manufactured by the first embodiment of the method of manufacturing a non-volatile semiconductor memory device of the present invention.

FIG. 1 is a cross-sectional view of a portion of a non-volatile semiconductor memory device manufactured by the first embodiment of the method of manufacturing a non-volatile semiconductor memory device of the present invention. The principal surface of a silicon substrate 10, which is an example of a semiconductor substrate, is divided into a first region 11 on which a memory cell 15 exemplifying the memory element in formed, and a second region 13 on which an access gate transistor 17 is formed. On the first region 11 is formed a silicon oxide layer 12 as a tunnel insulation layer, on which a floating gate 88, an ONO-layer 16 as a dielectric layer on the floating gate 88, and a control gate 84 are formed on the ONO-layer. On the control gate 84, a silicon oxide layer 76 having a thickness of 80 to 200 nm in formed as an example of the masking layer. Within the first region 11, a source/drain regions 96 and 97 are formed separately and in opposite positions across the control gate 84 and the floating gate 88.

Over the second region 13 is formed a gate oxide layer 20 as a gate insulation layer, on which a gate electrode 82 is formed. On the gate electrode 82, a silicon oxide layer 76 having a thickness of 200 to 300 nm is formed. Within the second region 13, source/drain regions 99 and 100 are formed separately and in opposite positions across the gate electrode 82.

On the principal surface of the silicon substrate 10 in the area between the floating gate 88 and the gate electrode 82, a groove section 90 is unavoidably formed. Over the area of the groove section 90. N type regions 94 and 98 are formed in such a way that the N+ type regions 94 and 98 overlap each other at the groove section 90, with the N+ type region 94 being formed in a deeper position than the N+ type region 98 in the silicon substrate 10. Part of the N+ type regions 94 and 98 positioned in the first region 11 constitute the source/drain 97, whereas part of the N+ type region 98 positioned in the second region 13 constitutes the source/drain 99. The impurity region comprising the N+ type regions 94 and 98 has a higher impurity concentration than that of the source/drain regions 96, 99, and 100.

On the principal surface of the silicon substrate 10, a silicon oxide layer 44 is formed 80 that it covers the memory cell 15 and the access gate transistor 17. On the silicon oxide layer 44, a contact hole 46a to expose source/drain 96, and a contact hole 46b to expose the source/drain 100 are formed. Over the silicon oxide layer 44. aluminum wiring layers 48a and 48b are provided. The aluminum wiring layer 48a is also formed within the contact hole 46a and is electrically connected with the source/drain 96, similarly, the aluminum wiring layer 48b in also formed within the contact hole 46b and is electrically connected to the source/drain 100.

Figure 2:
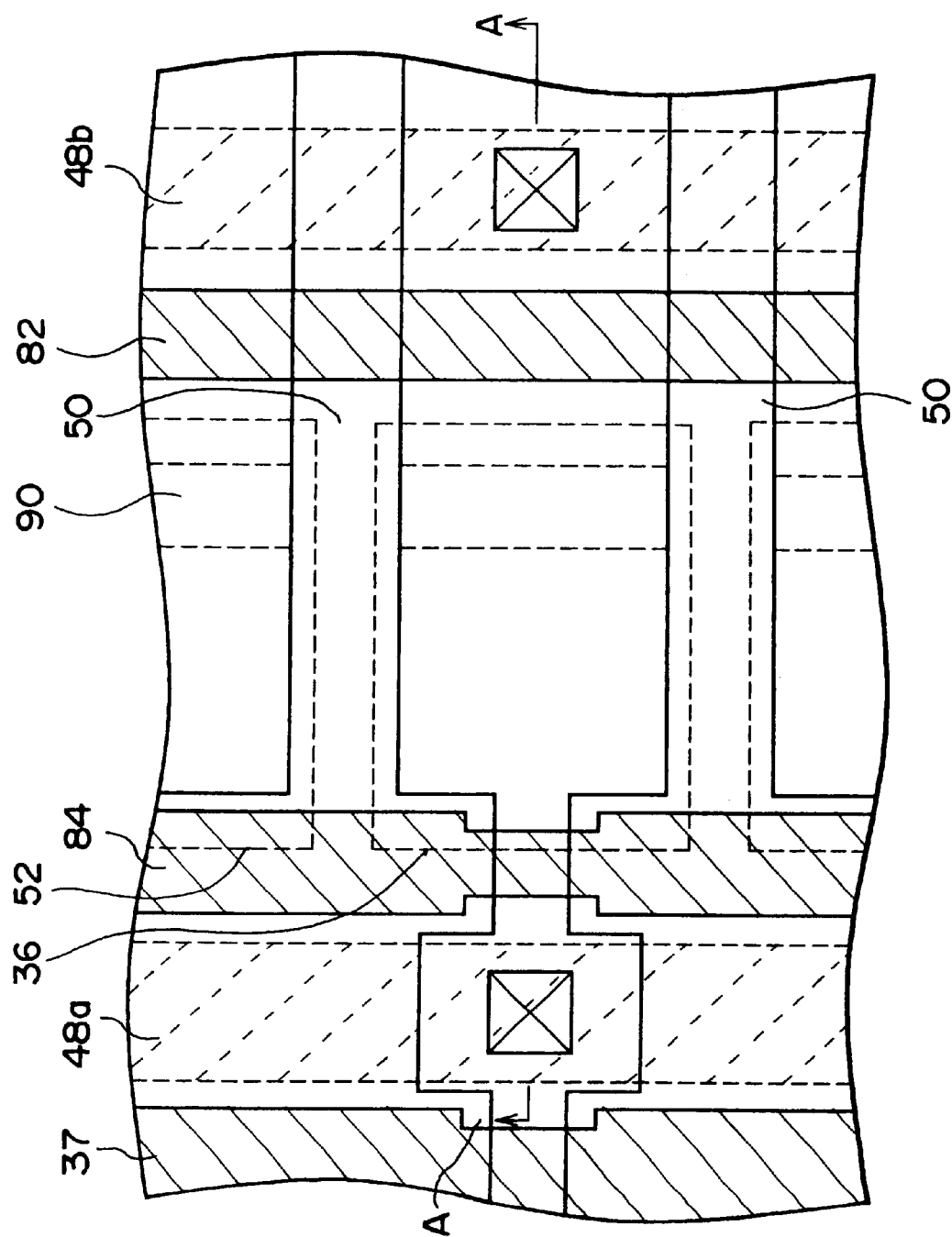
FIG. 2 is a partial plan view of a non-volatile semiconductor memory device manufactured by the first embodiment of the method of manufacturing a non-volatile semiconductor memory device of the present invention.

FIG. 2 is a plan view of the non-volatile semiconductor memory device shown in FIG. 5 at the segment indicated as 400A, and FIG. 1 is a cross-sectional view taken along the A—A line in the direction as indicated by the arrows. The illustration shows that the control gate 37, aluminum wiring layer 48a, control gate 84, groove section 90, gate electrode 82, and aluminum wiring layer 48b are formed with vertical spaces provided between them. The control gate 84 and the gate electrode 82 correspond respectively to the control gate 404 and the gate electrode 401A shown in FIG. 5.

Figure 6:
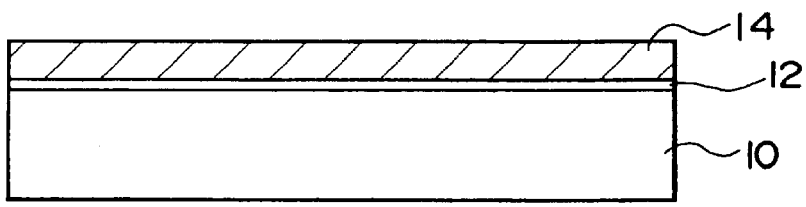
FIG. 6 is a partial cross-sectional view of the device to illustrate the first step of the first embodiment of the method of manufacturing a non-volatile semiconductor memory device of the present invention.

The first embodiment of the method of manufacturing the non-volatile semiconductor memory device according to the present invention is described below. As shown in FIG. 6, a silicon oxide layer 12 as the tunnel insulation layer having a thickness of 7 to 10 nm in grown on the principal surface of the silicon substrate 10 by means of a thermal oxidation method, for example. A polysilicon layer 14 having a thickness of 100 to 200 nm, exemplifying the first conductive layer, is then grown over the silicon oxide layer 12 by means of a CVD method, for example.

Figure 7:
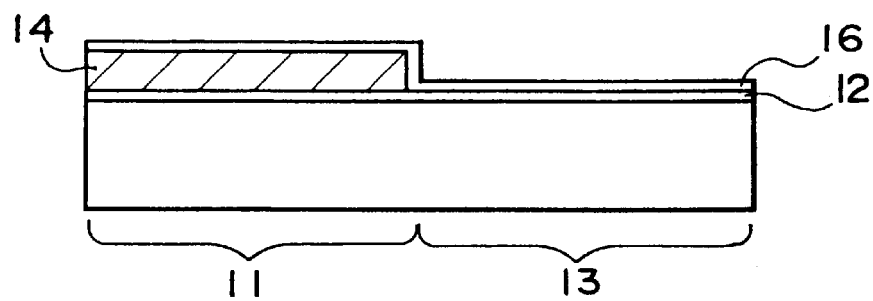
FIG. 7 is a partial cross-sectional view of the device to illustrate the second step of the first embodiment of the method of manufacturing a non-volatile semiconductor memory device of the present invention.
Figure 8:
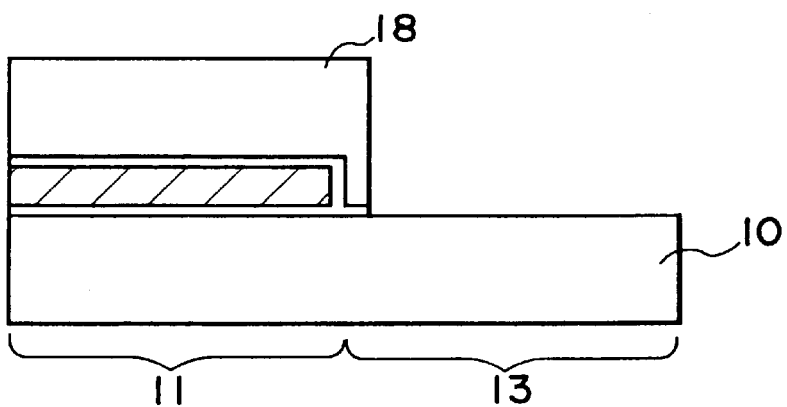
FIG. 8 is a partial cross-sectional view of the device to illustrate the third step of the first embodiment of the method of manufacturing a non-volatile semiconductor memory device of the present invention.

An shown in FIG. 7, the polysilicon layer 14 over the area of a second region 13 is selectively removed by a photo-etching technique, for example. Then an ONO-layer 16 is grown on the principal surface of the silicon substrate 10 to cover the polysilicon layer 14 on the first region 11. The oxide portions of the ONO layer 16 are formed for example by a CVD method or a thermal oxidation method, and the nitride portion in formed for example by a CVD method.

Figure 9:
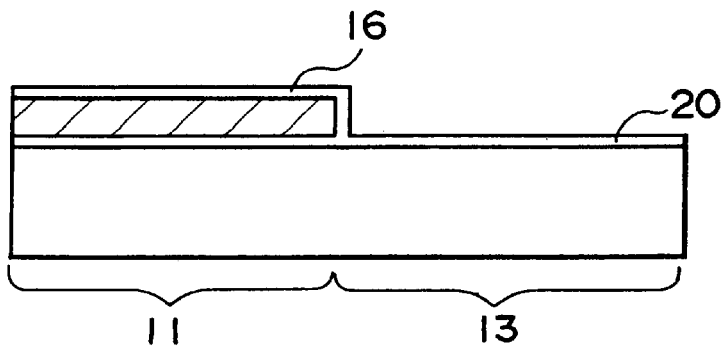
FIG. 9 is a partial cross-sectional view of the device to illustrate the fourth step of the first embodiment of the method of manufacturing a non-volatile semiconductor memory device of the present invention.
Figure 13:
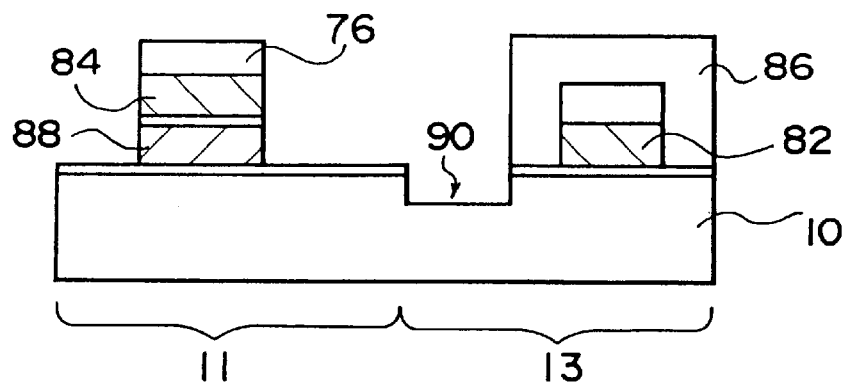
FIG. 13 is a partial cross-sectional view of the device to illustrate the eighth step of the first embodiment of the method of manufacturing a non-volatile semiconductor memory device of the present invention.

As shown in FIG. 13, a resist 18 is formed on the principal surface of the silicon substrate 10. The resist 16 over the area of the second region 13 is then removed. By using the resist 18 as a mask, the ONO-layer 16 and silicon oxide layer 12 over the area of the second region 13 are etched to expose the principal surface of the silicon substrate 10. As shown in FIG. 9, a gate oxide layer 20 having a thickness of 5 to 20 nm is grown on the second region 13 by a thermal oxidation method, for example.

Figure 10:
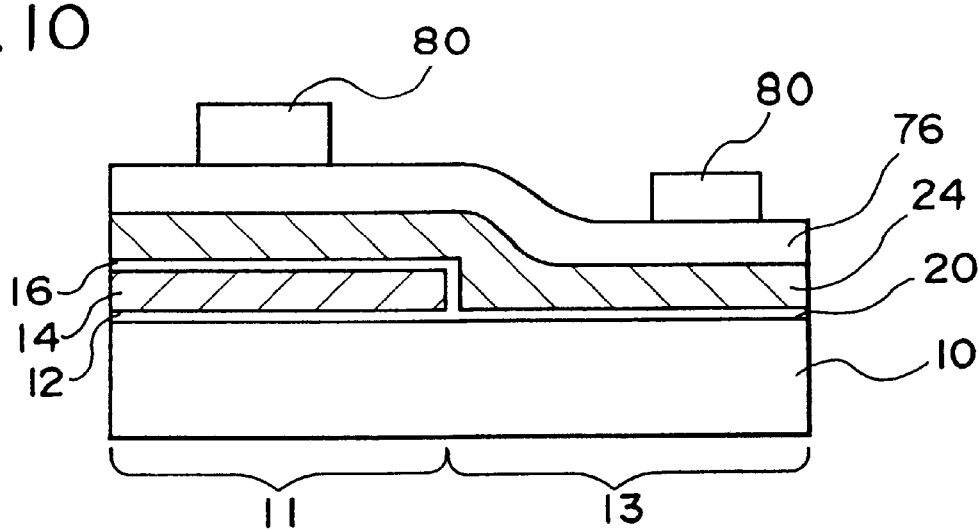
FIG. 10 is a partial cross-sectional view of the device to illustrate the fifth step of the first embodiment of the method of manufacturing a non-volatile semiconductor memory device of the present invention.

As shown in FIG. 10, a polysilicon layer 24 having a thickness of 200 to 400 nm exemplifying the second conductive layer in grown over the entire principal surface or the silicon substrate 10 by means of a CVD method, for example. Note here that other examples of the second conductive layer include a laminated structure of a polysilicon layer having a thickness of 80 to 200 nm and a layer of silicide such as $WSi_2$, $MoSi_2$, $CoSi_2$, $TiSi_2$ or other materials which is grown on the polysilicon layer to a thickness of 80 to 200 nm. Subsequently, a silicon oxide layer 76 having a thickness of 200 to 300 nm is formed on the polysilicon layer 24 by using, for example, a CVD method. The silicon oxide layer 76 is an example of the masking layer. Then a resist 80 as the second resist is prepared on the silicon oxide layer 76 and patterned for a control gate and a gate electrode.

Figure 11:
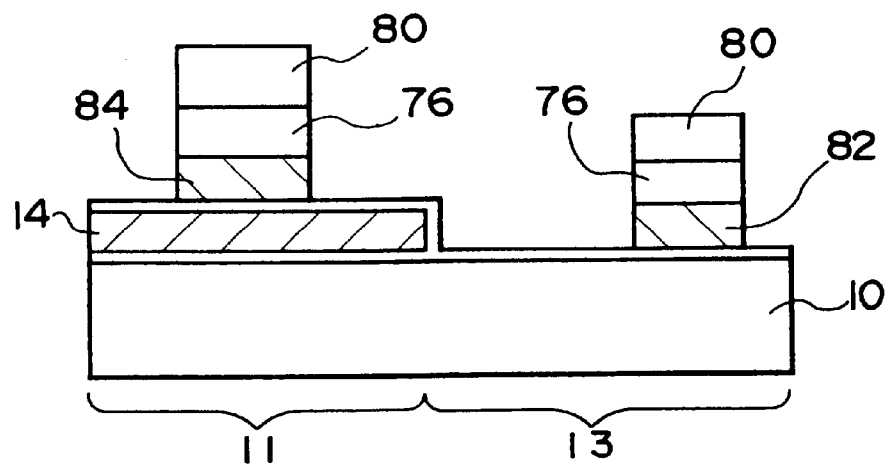
FIG. 11 is a partial cross-sectional view of the device to illustrate the sixth step of the first embodiment of the method of manufacturing a nonvolatile semiconductor memory device of the present invention.

As shown in FIG. 11, the silicon oxide layer 76 and the polysilicon layer 24 are selectively etched in succession by using the resist 80 as a mask to form a control gate 84 and a gate electrode 82 simultaneously, with the resist 80 being removed afterward.

Figure 12:
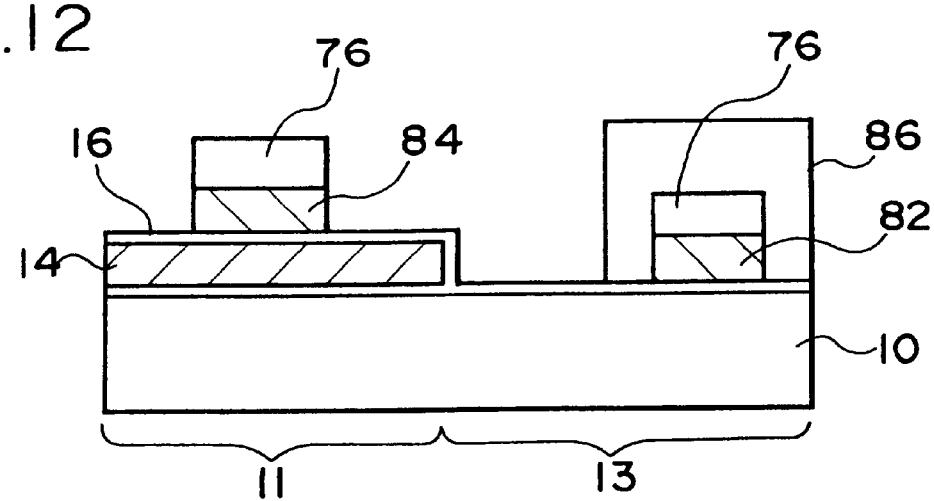
FIG. 12 is a partial cross-sectional view of the device to illustrate the seventh step of the first embodiment of the method of manufacturing a non-volatile semiconductor memory device of the present invention.

Subsequently, a resist 86 is prepared over the principal surface of the silicon substrate 10, and then patterned to cover the gate electrode 82, as shown in FIG. 12. The resist 86 thus prepared is the first resist.

As shown in FIG. 13, the ONO-layer 16 is selectively etched by using as a mask the silicon oxide layer 76 and the resist 86 on the control gate 84, to leave a portion of the ONO-layer 16 positioned underneath the control gate 84. By the selective etching of the ONO-layer 16 in the above, the silicon oxide layer 20 on the principal surface of the silicon substrate 10 is also etched at the position between the floating gate and the gate electrode to expose the principal surface of the silicon substrate 10. A floating gate 88 is then formed by selectively etching the polysilicon layer 14. By the above etching, the exposed portion of the silicon substrate 10 at the principal surface is also etched to form a groove section 90 having a depth of 100 to 300 nm in the silicon substrate.

As described in the step shown in FIG. 13, the silicon oxide layer 76 on the control gate 84 is used as a mask for selectively etching the ONO-layer 16 and the polysilicon layer 14. Since the above etching removes a portion of the silicon oxide layer 76 on the control gate 84, the thickness of the silicon oxide layer 76 on the control gate 84 becomes smaller than that of the silicon oxide layer 76 on the gate electrode 82.

Figure 14:
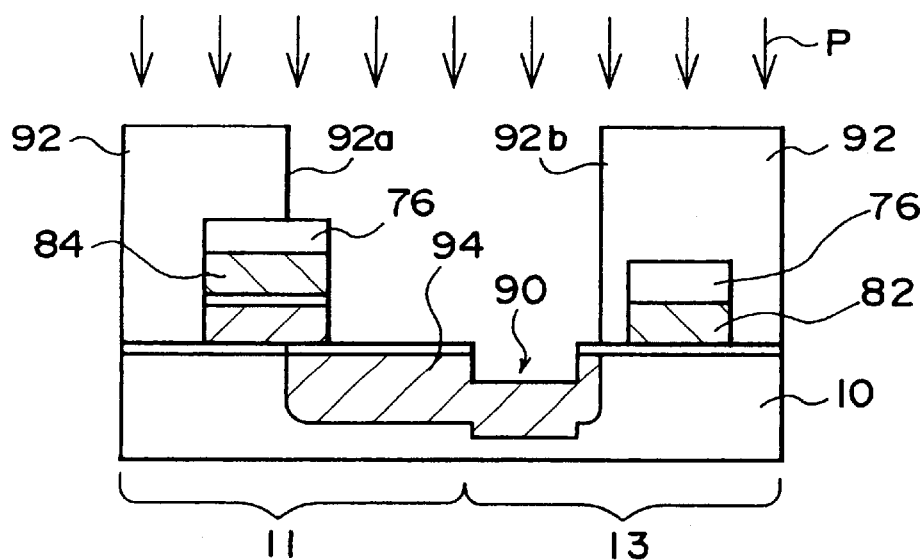
FIG. 14 is a partial cross-sectional view of the device to illustrate the ninth step of the first embodiment of the method of manufacturing a non-volatile semiconductor memory device of the present invention.

Referring to FIG. 14, a resist 92 is formed over the principal surface of the silicon substrate 10. The resist 92 is then patterned to cover the first region 11 on which a source/drain 96 is formed while its edge 92a is positioned on the control gate 84 and also to cover the second region 13 on which a source/drain 100 is formed while its edge 92b is positioned between the gate electrode 82 and the groove section 90.

By using the resist 92 as a mask, a phosphorus ion implantation is provided over an area covering the groove section 90 on the principal surface of the silicon substrate 10, under conditions of energy of 40 to 120 KeV and a dosage of $1E14/cm^2$ to $6E15/cm^2$. A phosphorus or arsenic ion implantation is then performed under conditions of 30 to 80 Kev and $1E15/cm^2$ to $6E15/cm^2$. After these ion implantations, a thermal treatment is provided on the diffused ions to form an NB type region 94, having a thickness of 200 to 600 nm with an impurity concentration of $1E18/cm^2$ to $1E21/cm^3$. The thermal treatment for forming the N+ type region 94 is performed under an $N_2$ or $N_2/O_2$ atmosphere for 30 to 180 minutes at 900 to 950° C. With the above-mentioned ion implantations and thermal treatment, the N+ type region 94 is formed on the principal surface of the silicon substrate 10 so that it covers the groove section 90.

Figure 15:
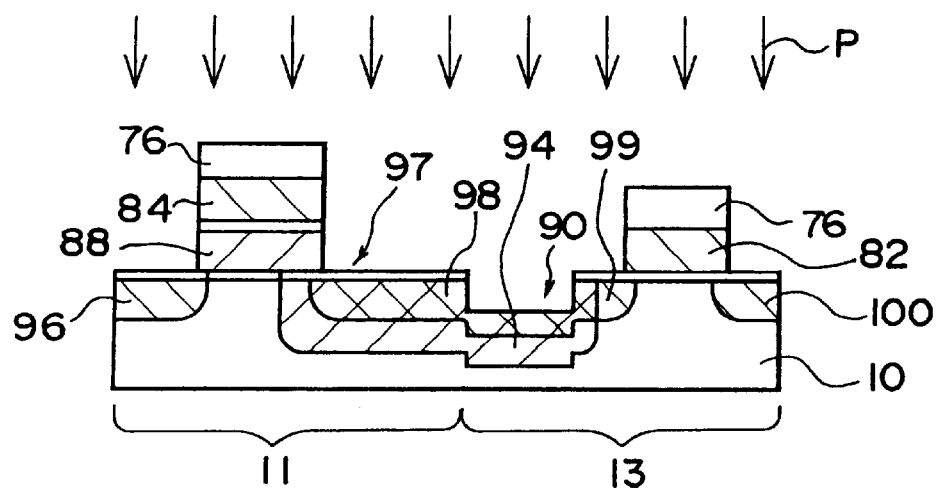
FIG. 15 is a partial cross-sectional view of the device to illustrate the tenth step of the first embodiment of the method of manufacturing a non-volatile semiconductor memory device of the present invention.

As shown in FIG. 15, a phosphorus ion implantation is then provided over the principal surface of the silicon substrate 10 by using as masks the silicon oxide layer 76 on the control gate 84 and the silicon oxide layer 76 on the gate electrode 82, under conditions of an energy of 40 to 120 KeV and a dosage of $5E12/cm^2$ to $5E14/cm^2$. A phosphorus or arsenic ion implantation is then performed under conditions of 30 to 80 KeV and $1E15/cm^2$ to $6E15/cm^2$. After these ion implantations and a thermal treatment, the source/drain 96, an N+ type region 98, and the source/drain 100 are formed. The N+ type region 98 has a thickness of 100 to 400 nm and an impurity concentration of $1E17/cm^3$ to $1E21/cm^3$.

Referring to FIG. 1, a silicon oxide layer 44 as an interlayer insulation layer is formed over the entire principal surface of the silicon substrate 10 by a CVD method, for example. As the interlayer insulation layer, a PSG layer, an B0G layer, or a BPSG layer can be used in place of the silicon oxide layer. The interlayer insulation layer can also be of a single layer of PSG, SOG, or BPSG, or of a multi-layered structure combining a silicon oxide layer, a PSG layer, a SOG layer, or a BPSC layer. Next, by using an appropriately patterned resist, the silicon oxide layer 44 is selectively etched to form a contact hole 46a to expose the source/drain 96, as well as a contact bole 46b to expose the source/drain 100. Subsequently, an aluminum layer is grown over the silicon oxide layer 44 by means of sputtering, for example, and then aluminum wiring layers 48a and 48b are formed by providing a patterning on the aluminum layer. Note that aluminum alloy wiring layer comprising aluminum and other metals such as copper could also be used in place of the aluminum wiring layer.

In the present embodiment, as shown in FIG. 11, since the control gate 84 and the gate electrode 82 are simultaneously formed, there is no need to consider the margin for aligning the masks for forming the control gate 84 and the gate electrode 82. Consequently, the space between the control gate 84 and the gate electrode 82 can be reduced, thereby contributing to microminiaturization of the non-volatile semiconductor memory device.

Furthermore, in the present embodiment, the impurity region comprising the N+ type regions 94 and 98 in the groove section 90 are formed by the two ion implantations described with reference to FIG. 14 and FIG. 15. Meanwhile, the source/drain regions 96, 99, and 100 are formed by the ton implantation described with reference to FIG. 15, under the conditions for depth and concentration of impurities required for these source/drain regions. Consequently, the present embodiment allows the formation of the source/drain regions 96. 99, and 100 with the necessary depth and concentration of impurities while lowering the diffusion resistance of the impurity region at the groove section 90. Moreover, since the edge 92a of the resist 92 is not positioned between the control gate 84 and the groove section 90, there is no need to consider the mask alignment margin for the area between the control gate and the groove section, enabling shortening the space between the control gate and the groove section, thereby achieving a high cell density and a high degree of integration for the non-volatile semiconductor memory device.

Second Embodiment

Figure 16:
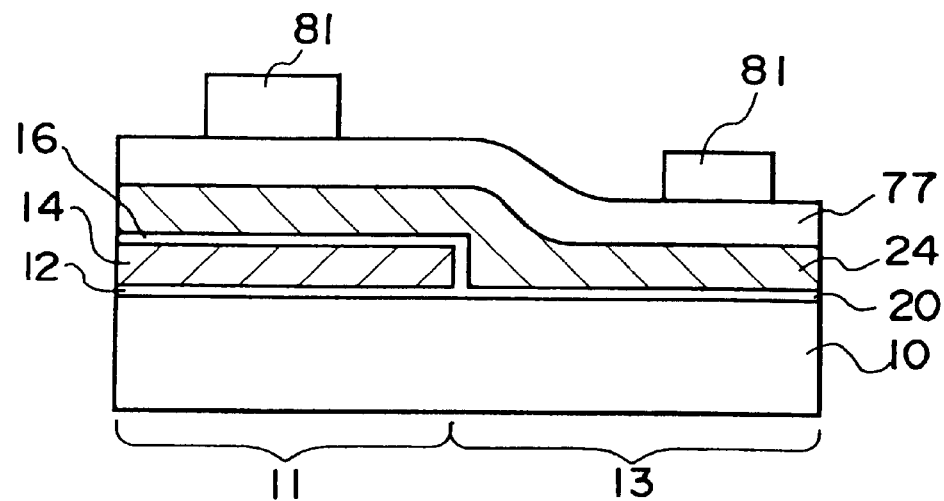
FIG. 16 is a partial cross-sectional view of the device to illustrate the first step of the second embodiment of the method of manufacturing a non-volatile semiconductor memory device of the present invention.
Figure 17:
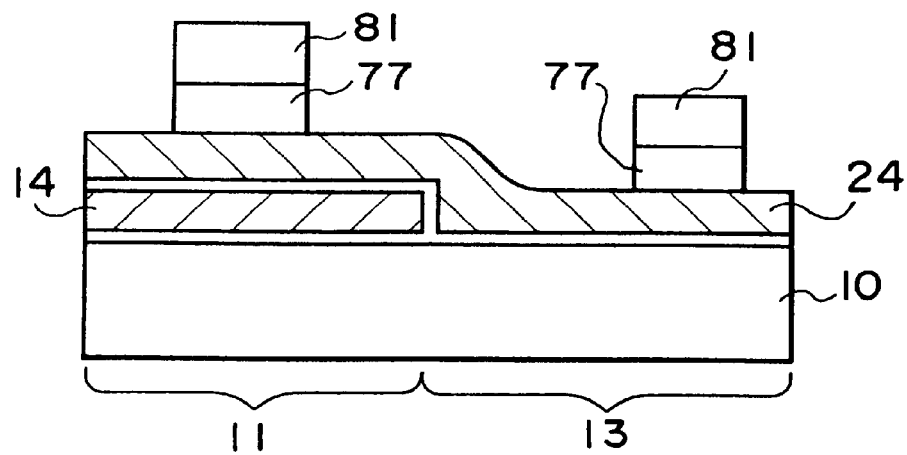
FIG. 17 is a partial cross-sectional view of the device to illustrate the second step of the second embodiment of the method of manufacturing a non-volatile semiconductor memory device of the present invention.

The second embodiment of the present invention is described below. Referring to FIG. 16, the fabrication steps up to the formation of the polysilicon layer 24 are performed as in the first embodiment. On the polysilicon layer 24, a silicon oxide layer 77 having a thickness of 200 to 300 nm is grown by means of a CVD method, for example. This silicon oxide layer 77 exemplifies the masking layer. A resist 81 as the third resist is formed on the silicon oxide layer 77 and provided with a desired pattern. Referring to FIG. 17, by using the resist 81 as a mask, the silicon oxide layer 77 is first selectively etched. After removing the resist 61 an shown in FIG. 18, the polysilicon layer 24 is selectively etched by using the silicon oxide layer 77 as a mask to simultaneously form a control gate 104 and a gate electrode 102.

Figure 19:
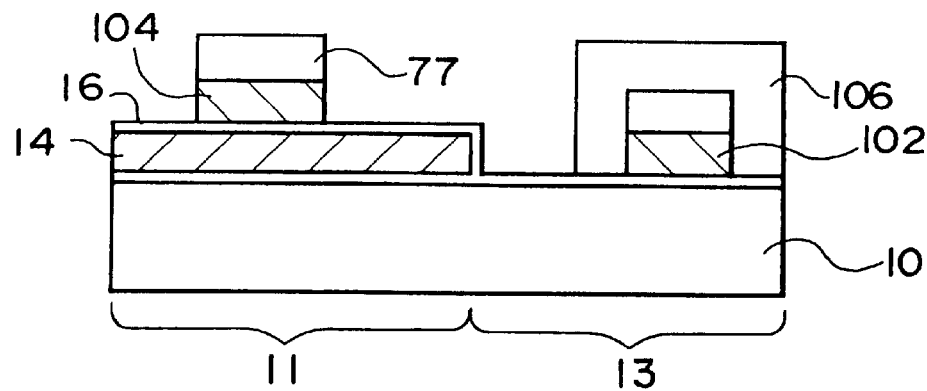
FIG. 19 is a partial cross-sectional view of the device to illustrate the fourth step of the second embodiment of the method of manufacturing a non-volatile semiconductor memory device of the present invention.
Figure 20:
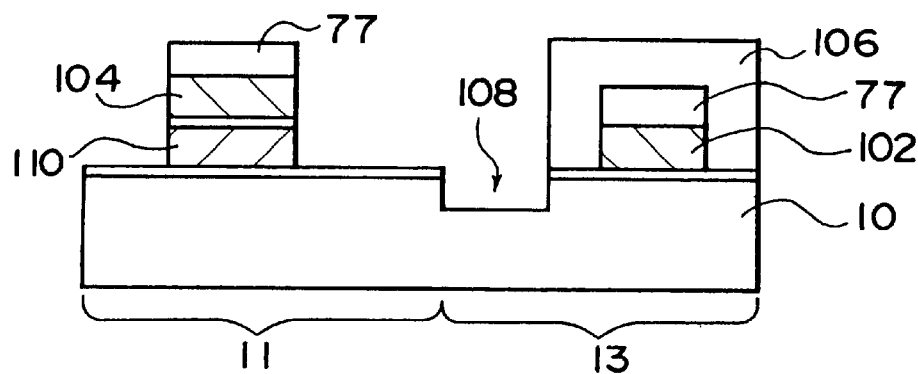
FIG. 20 is a partial cross-sectional view of the device to illustrate the fifth step of the second embodiment of the method of manufacturing a non-volatile semiconductor memory device of the present invention.

As shown in FIG. 19, a resist 106 in formed on the principal surface of the silicon substrate 10 and patterned to cover the gate electrode 102. The above resist corresponds to the first resist. Referring to FIG. 20, by using the silicon oxide layer 77 on the control gate 104 and the resist 106 as masks, the ONO-layer 16 and the polysilicon layer 14 are selectively etched in succession to form a floating gate 110. In this a step, a groove section 108 is formed on the principal surface of the silicon substrate 10 in the area between the floating gate 110 and the gate electrode 102, in the same unavoidable manner as described in the first embodiment.

An described in the step shown in FIG. 20, the silicon oxide layer 77 formed on the control gate 104 is used as a mask for selectively etching the ONO-layer 16 and the polysilicon layer 14. Since the above etching removes a portion of the silicon oxide layer 77, the thickness of the silicon oxide layer 77 on the control gate 104 becomes smaller than that of the silicon oxide layer 77 on the gate electrode 102.

Figure 21:
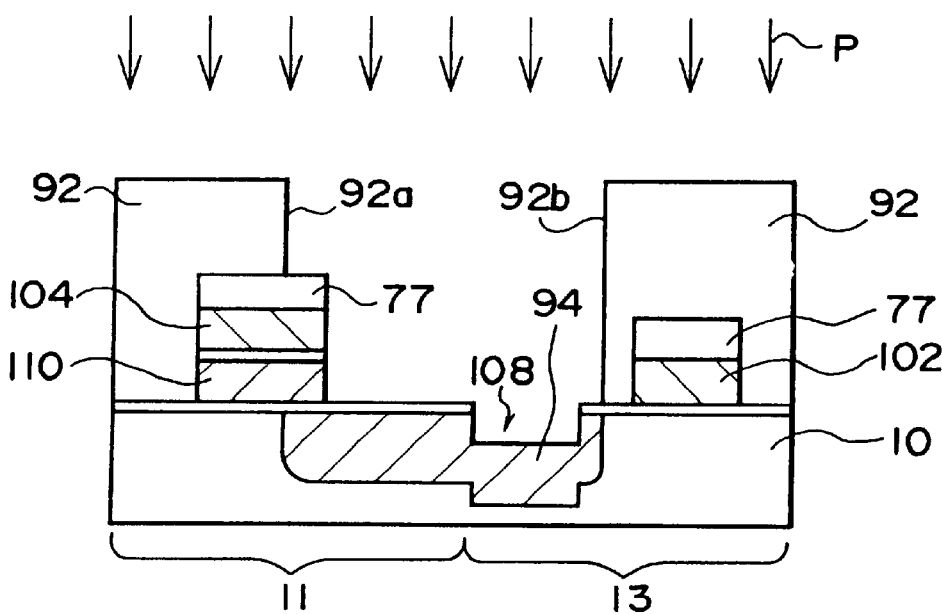
FIG. 21 is a partial cross-sectional view of the device to illustrate the sixth stop of the second embodiment of the method of manufacturing a non-volatile semiconductor memory device of the present invention.

Referring to FIG. 21, a resist 92 is formed on the principal surface of the silicon substrate 10. The resist 92 is patterned so that the resist 92 covers the first region 11 on which the source/drain 96 is formed while its edge 92a is positioned on the control gate 104, and also covers the second region 13 on which the source/drain 100 is formed while its edge 92b is positioned between the gate electrode 102 and the groove section 108. By using the resist 92 as a mask, the first ion implantation is performed on the silicon substrate 10, followed by a thermal treatment to form an N' type region 94 covering the groove section 108. The conditions for the above ion implantation and the thermal treatment are the same as in the first embodiment.

Figure 22:
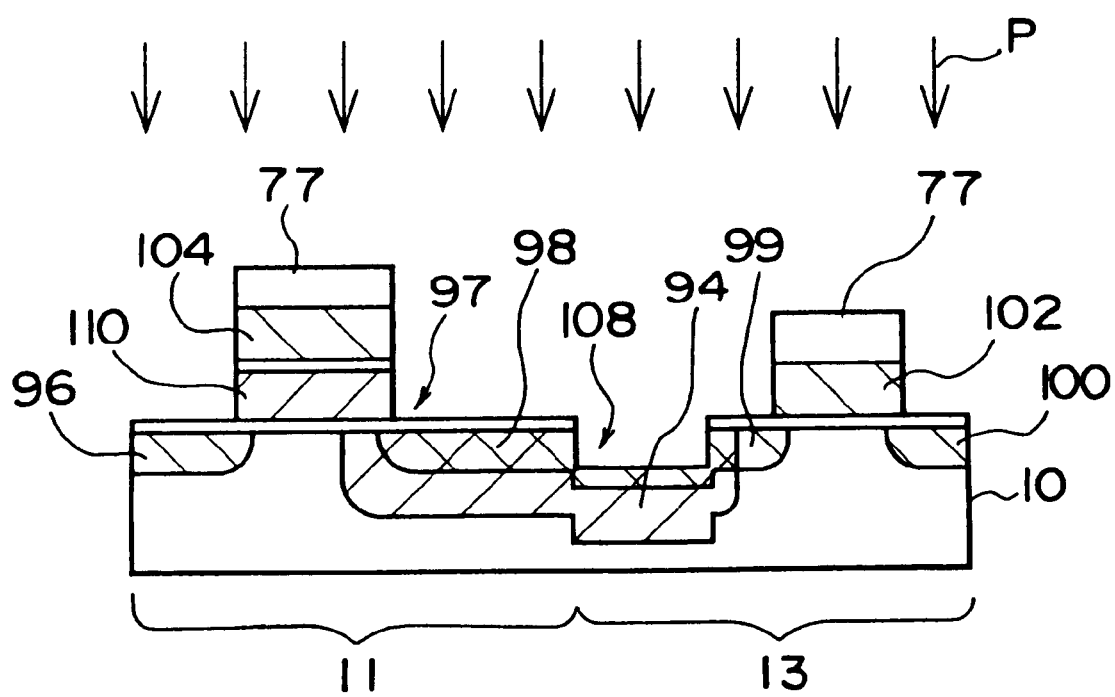
FIG. 22 is a partial cross-sectional view of the device to illustrate the seventh step of the second embodiment of the method of manufacturing a non-volatile semiconductor memory device of the present invention.
Figure 23:
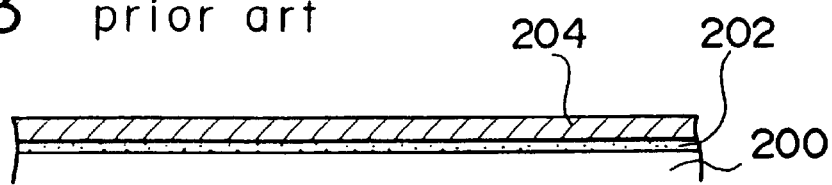
FIG. 23 is a partial cross-sectional view of the device to illustrate the first steep of a conventional method of manufacturing a non-volatile semiconductor memory device.
Figure 24:
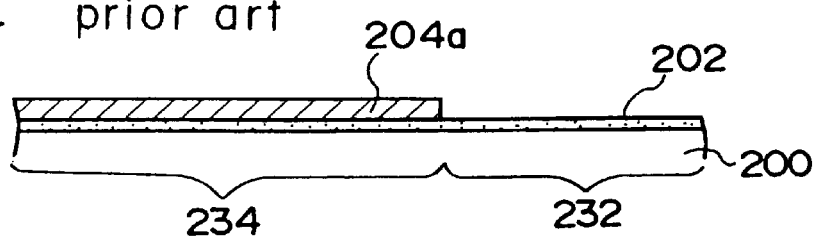
FIG. 24 is a partial cross-sectional view of the device to illustrate the second step of a conventional method of manufacturing a non-volatile semiconductor memory device.
Figure 25:
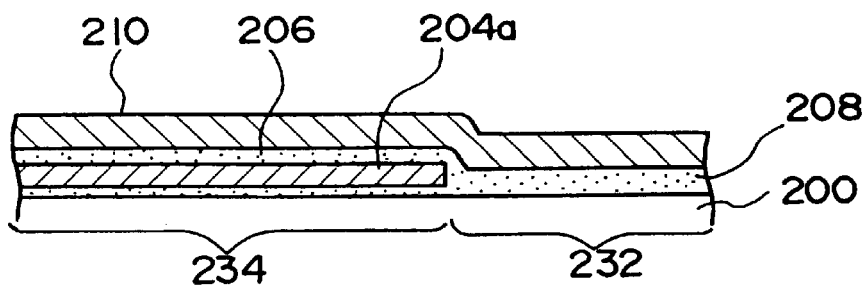
FIG. 25 is a partial cross-sectional view of the device to illustrate the third step of a conventional method of manufacturing a non-volatile semiconductor memory device.
Figure 26:
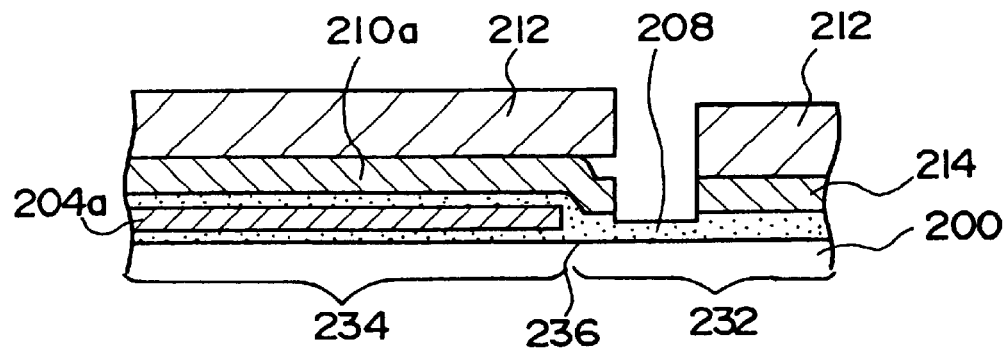
FIG. 26 is a partial cross-sectional view of the device to illustrate the fourth step of a conventional method of manufacturing a non-volatile semiconductor memory device.
Figure 27:
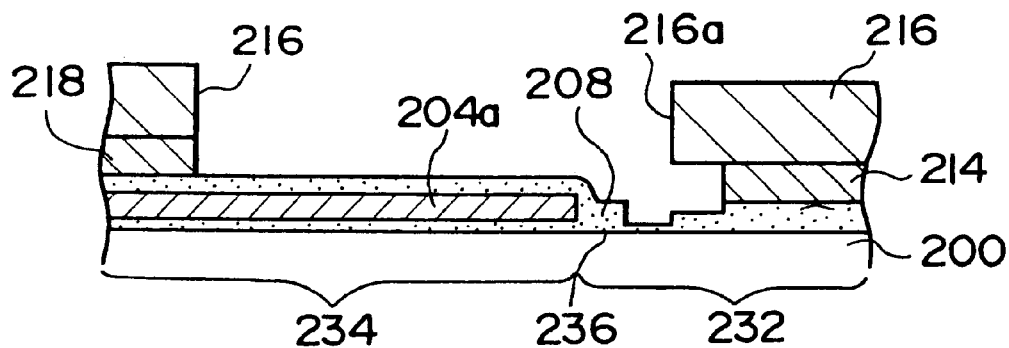
FIG. 27 is a partial cross-sectional view of the device to illustrate the fifth step of a conventional method of manufacturing a non-volatile semiconductor memory device.
Figure 28:
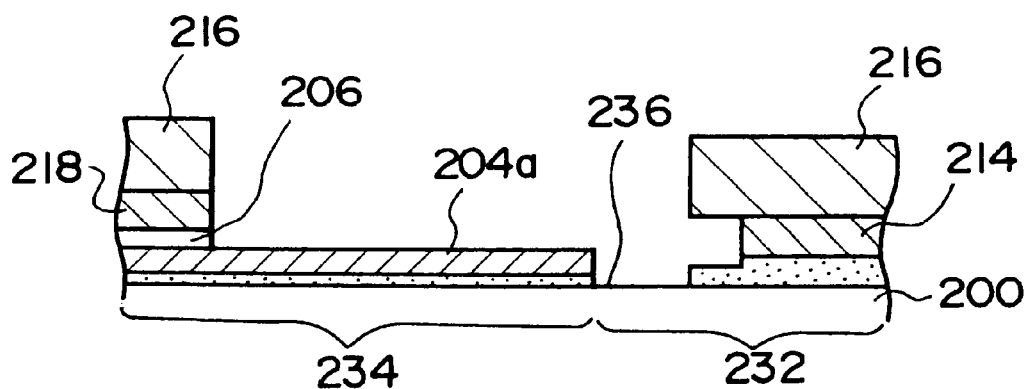
FIG. 28 is a partial cross-sectional view of the device to illustrate the sixth step of a conventional method of manufacturing a non-volatile semiconductor memory device.
Figure 29:
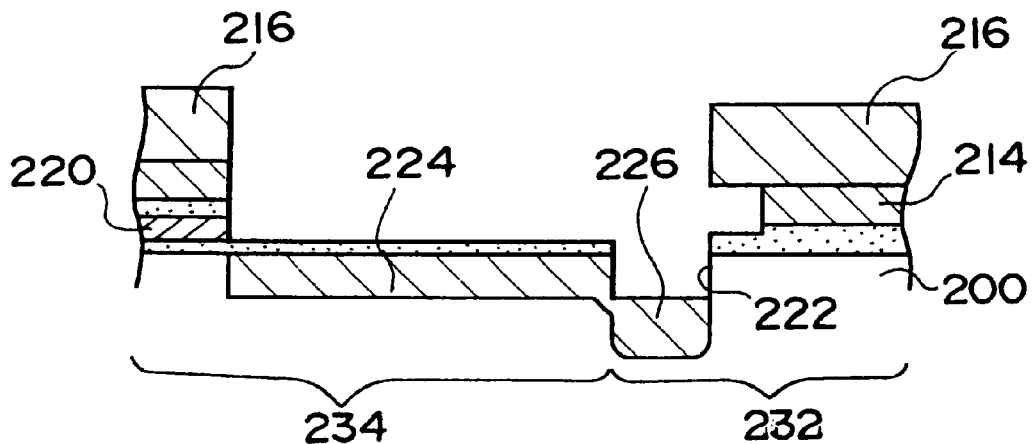
FIG. 29 is a partial cross-sectional view of the device to illustrate the seventh step of a conventional method of manufacturing a non-volatile semiconductor memory device.
Figure 30:
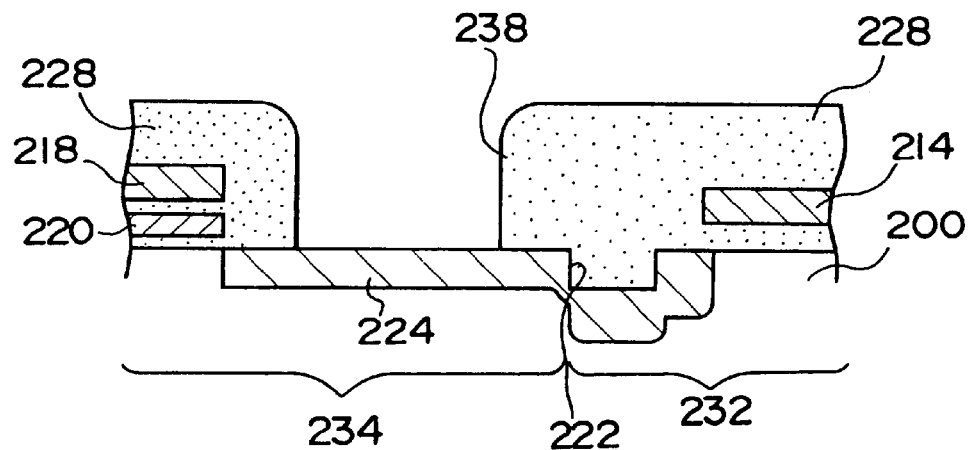
FIG. 30 is a partial cross-sectional view of the device to illustrate the eighth step of a conventional method of manufacturing a non-volatile semiconductor memory device.
Figure 31:
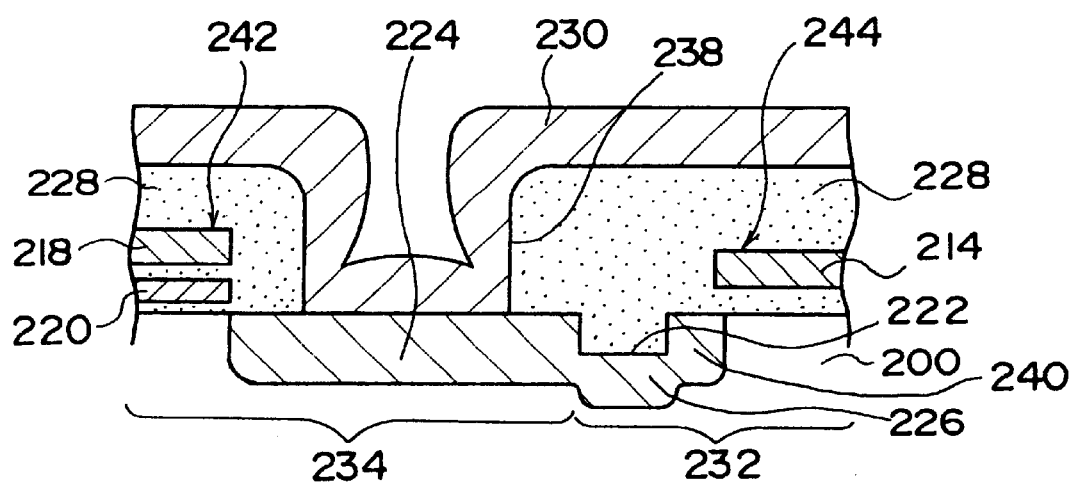
FIG. 31 is a partial cross-sectional view of the device to illustrate the ninth step of a conventional method of manufacturing a non-volatile semiconductor memory device.

Next, referring to FIG. 22, a second ion is implantation is performed on the principal surface of the silicon substrate 10 by using as masks the silicon oxide layer 77 on the control gate 104 and also the silicon oxide layer 77 on the gate electrode 102. After a subsequent thermal treatment, source/drain regions 96 and 100 as well as an N+ type region 98 covering the groove section 108 are formed. The conditions for the ion implantation are the same as in the first embodiment. Part of the N + type regions 94 and 98 located in the first region 11 constitute the source/drain 97. Part of the N+ type regions 98 located in the second region 13 constitutes the source/drain 99. The rest of the fabrication steps are the same as in the first embodiment.

Figure 18:
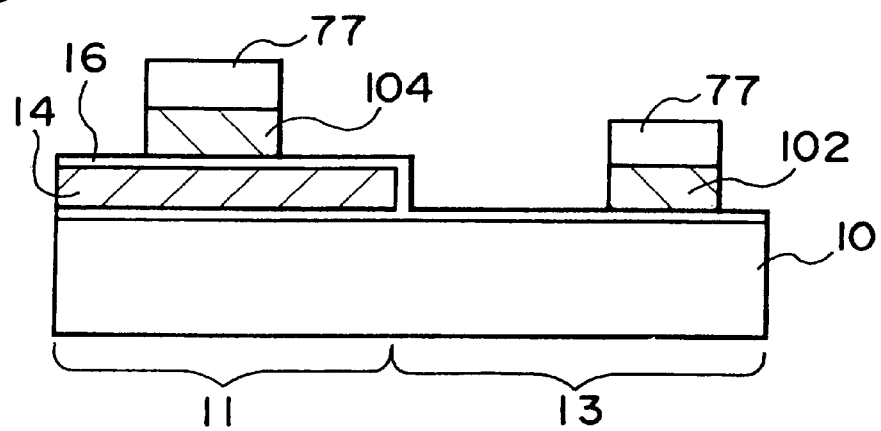
FIG. 18 is a partial cross-sectional view of the device to illustrate the third step of the second embodiment of the method of manufacturing a non-volatile semiconductor memory device of the present invention.

In addition to the same effects as described for the first embodiment, the present embodiment has the following effect. As shown in FIG. 18, this embodiment forms the control gate 104 and the gate electrode 102 by using the silicon oxide layer 77 as a mask. Consequently, the control gate and the gate electrode can be formed with a more accurate shape than a method of forming the same by using a resist as the mask.

What is claimed is:

1. A method of manufacturing a non-volatile semiconductor memory device that includes:

a semiconductor substrate including a first region and a second region;

at least one memory element including a floating gate formed in said first region and a control gate formed on said floating gate; and at least one access transistor for selectively activating said memory element being formed in the second region, comprising a gate electrode;

said method including the steps of;

forming a first insulation layer on said semiconductor substrate;

forming on the first insulation layer a first conductive layer;

selectively etching said first conductive layer in said second region;

forming a dielectric layer over the entire surface of said semiconductor substrate;

selectively etching said dielectric layer and said first insulation layer in said second region;

forming a second insulation layer on said second region;

forming a second conductive layer over the entire surface of said semiconductor substrate;

forming on said second conductive layer a masking layer that has a different etching rate from said first conductive layer and functions as a mask when said first conductive layer is selectively etched;

selectively etching said second conductive layer by using said masking layer as a mask to form said control gate and gate electrode;

forming a first resist which covers said gate electrode;

selectively etching said first conductive layer by using said masking layer on said control gate as well as said first resist as masks to form said floating gate;

unavoidably forming a groove section on said semiconductor substrate that is not covered by said first resist in said second region through said step of selectively etching said first conductive layer; and forming in said semiconductor substrate an impurity region which electrically connects a source/drain of said memory element to a source/drain of said access gate transistor and covers said groove section.

2. The method of manufacturing a non-volatile semiconductor memory device as defined in claim 1, further comprising steps of:

forming a second resist on said masking layer; and selectively etching said masking layer by using said second resist as a mask, said steps being provided between the step of forming said masking layer and the step of forming said control gate and gate electrode.

3. The method of manufacturing a non-volatile semiconductor memory device as defined in claim 1, wherein the serial steps from forming said masking layer up to simultaneously forming said control gate and gate electrode comprise the steps of:

forming a third resist on said masking layer;

selectively etching said masking layer by using said third resist as a mask; and selectively etching said second conductive layer by using said masking layer as a mask to form said control gate and gate electrode simultaneously.

4. The method of manufacturing a non-volatile semiconductor memory device an defined in claim 1, wherein said masking layer comprises an insulation layer.

5. The method of manufacturing a non-volatile semiconductor memory device as defined in claim 1, wherein said masking layer comprises a silicon oxide layer.

6. The method of manufacturing a non-volatile semiconductor memory device as defined in claim 1, wherein said masking layer has a thickness from 200 to 300 nm.

7. The method of manufacturing a non-volatile semiconductor memory device as defined in claim 1, wherein said non-volatile semiconductor memory device is provided with a plurality of said memory elements and a plurality of said access gate transistors, each of said access gate transistors selectively activating only one of said memory elements.

8. The method of manufacturing according to claim 1, wherein said impurity region is formed in a region between said floating gate and said gate electrode on said principal surface by a first ion implantation and a second ion implantation.

* * * * *